United States Patent [19]
Waku

[11] B 3,995,233
[45] Nov. 30, 1976

[54] TEMPERATURE COMPENSATED VARIABLE FREQUENCY CRYSTAL OSCILLATOR

[75] Inventor: Toshihiko Waku, Tokyo, Japan

[73] Assignee: Sony Corporation, Tokyo, Japan

[22] Filed: Nov. 27, 1974

[21] Appl. No.: 527,693

[44] Published under the second Trial Voluntary Protest Program on February 3, 1976 as document No. B 527,693.

[30] Foreign Application Priority Data
Dec. 5, 1973 Japan.............................. 48-138442

[52] U.S. Cl............................. 331/116 R; 331/176; 331/177 V; 332/26; 332/30 V
[51] Int. Cl.²...................... H03B 5/04; H03B 5/36; H03C 3/22
[58] Field of Search.................. 331/116 R, 66, 176, 331/177 V; 332/26, 30 V

[56] References Cited
UNITED STATES PATENTS
3,373,379   3/1968   Black.............................. 331/176 X
3,569,865   3/1971   Healey......................... 331/177 V X

*Primary Examiner*—Siegfried H. Grimm
*Attorney, Agent, or Firm*—Lewis H. Eslinger; Alvin Sinderbrand

[57] ABSTRACT

A temperature compensated variable oscillator formed of at least two capacitors and a resonator, or vibrator, made of lithium tantalate, in which an inductance element whose inductance value can be varied is connected in series to the vibrator; the capacitance of one of said capacitors is changed linearly in response to temperature variations, and the capacitance of the other capacitor is changed in response to temperature variations, in accordance with a second order relationship between capacitance and temperature, the graphical representation of such relationship being a second degree curve opening upward.

5 Claims, 8 Drawing Figures

TEMPERATURE COMPENSATED VARIABLE FREQUENCY CRYSTAL OSCILLATOR

BACKGROUND OF THE INVENTION

1. Field of the Invention

The present invention relates generally to a variable oscillator, and more particularly to a novel temperature compensated variable oscillator using lithium tantalate as its resonator, or vibrator.

2. Description of the Prior Art

In the art, the crystal resonator, or vibrator, which is used as an oscillating element is operated in a frequency range within which the reactance of the crystal vibrator is inductive. However, its reactance variation or inductance variation sharply varies in this frequency range, as is well known. Accordingly, an oscillator circuit employing the crystal vibrator can produce a stable oscillation frequency for temperature changes, but can not be used as a variable frequency oscillator circuit with a broad band of frequency variations such as, for example, an FM modulator circuit, because only a small range of variation in oscillation frequency can be obtained from the inductance variation of the vibrator.

A single crystal vibrator of lithium tantalate (LiTaO$_3$), which is a piezo-electric element, has an inductance component which is greater than that of the crystal vibrator, on the order of several tens of times. Hence the inductance variation of the lithium tantalate vibrator within the aforenoted frequency range is gradual rather than sharp, so that the range of variation in oscillation frequency is widened. As a result, if lithium tantalate is used as an oscillating element, the above mentioned FM modulator circuit can be realized.

A typical example of such a variable oscillator circuit has been proposed. This proposed circuit is shown in FIG. 1 of the accompanying drawings at 10. The illustrated variable oscillator circuit 10 is connected as a pierce type oscillator. In FIG. 1, reference numeral 1 designates a vibrator made of lithium tantalate LiTaO$_3$ as the oscillating element, Q is a transistor for oscillation, 2 and 3 are capacitors for oscillation, and 11 is an input terminal which is supplied with a modulation signal such as, for example, an audio signal. A variable capacitance 12, such as a variable capacity diode, is connected to the vibrator 1 of LiTaO$_3$, the capacitance being varied by the modulation signal to vary the oscillation frequency $f_o$ of the circuit. Reference numeral 13 indicates an output terminal.

When the variable oscillator circuit 10 is included in an FM modulator circuit, the FM modulator, for both general use and for the specific use in a wireless microphone desirably should satisfy the following conditions:

I. The oscillation frequency (carrier frequency) $f_o$ can be selected from a wide range.
II. The frequency deviation at the desired (used) oscillation frequency $f_o$ can be relatively large.
III. The temperature dependent frequency characteristics are good.

The condition I is especially necessary for the application wherein the variable oscillator circuit is employed in the wireless microphone. That is, when the variable oscillator circuit 10 is used as the FM modulator circuit in the manner described above, its oscillation frequency $f_o$ is generally selected within a carrier frequency band between 76 MH$_z$ and 90 MH$_z$. If the oscillation frequency $f_o$ is selected at, for example, 78 MH$_z$, this oscillation frequency $f_o$ may be obtained directly from the oscillator circuit 10 itself or by choosing the oscillation frequency of the oscillator circuit 10 to be lower than the required frequency and then multiplying it by an appropriate factor. When the carrier frequency is selected to be 78 MH$_z$ as above, an oscillation frequency $f_s$ of the oscillator circuit 10 may be set at 26 MH$_z$ and then this frequency should be multiplied by the factor of 3 to obtain the necessary carrier frequency $f_o$ of 78 MH$_z$.

Accordingly, if such a wireless microphone is used in an area where the electric field strength or intensity of surrounding FM broadcasting waves is relatively strong; and if the carrier frequency derived from the oscillator circuit 10 is selected to be close to an FM broadcasting frequency, then although the oscillator circuit output signal is received by an FM radio receiver with an AFC (automatic frequency control), only the FM broadcasting wave is processed due to the fact that the FM broadcasting wave has stronger electric field strength. Consequently, there is a strong possibility that the output signal from the oscillator circuit 10 can not be satisfactorily received by the FM radio receiver. Further, if the oscillation frequency $f_o$ is even closer to the carrier of the FM broadcasting wave, it is quite possible that an interference occurs therebetween.

Therefore, it is desired that the oscillation frequency $f_o$ or $f_s$ be capable of being varied to some extent. A variable frequency range $\Delta f$ of about 2 ~ 3 MH$_z$ will be sufficient for practical use.

The frequency range, within which the lithium tantalate (LiTaO$_3$) vibrator 1 becomes inductive, is generally limited to about 1.6 MH$_z$ at the oscillation frequency $f_s$ of 26 MH$_z$, so that the full extent of the above variable frequency range $\Delta f$ can not be presented by the circuit construction illustrated only in FIG. 1. In addition, for the case where the oscillation frequency $f_s$ is taken as the carrier frequency and is modulated with the audio signal (modulating signal) derived from the wireless microphone, even if the capacitors 2 and 3 shown in FIG. 1 are changed so as to change the oscillation frequency, the desired variable frequency range $\Delta f$ noted above can not be obtained. For the desirably large variable frequency range, the variable capacity range of the capacitors must be in the range of several pF to several hundred pF, which can not be realized.

However, if, as shown in FIG. 1, an inductance element such as a coil 4 in the illustrated example is connected in series to the vibrator 1 of LiTaO$_3$ and its inductance is varied, the reactance characteristics of the oscillator circuit can be varied sufficiently. Thus, the above conditions I and II can be satisfied.

FIG. 2 of the accompanying drawings is a graph showing the admittance characteristic of the lithium tantalate vibrator 1 in which the abscissa represents an oscillation frequency $f$ and the ordinate the admittance Y. In the graph of FIG. 2, $f_a$ indicates a parallel resonance frequency, as is well known, and $f_r$ a series resonance frequency. Accordingly, an oscillation frequency within a frequency range determined by a variation curve $l_1$, where the reactance becomes inductive, is generally used, which is a frequency range of about 1.6 MH$_z$ as described above. If, in the above graph of the characteristic curves, the inductance of the coil 4 is varied, the variation curve is changed from a curve $l_2$ to a curve $l_4$ whereby the series resonance frequency $f_r$ is lowered as the inductance value is increased and hence the frequency range, within which the reactance becomes inductive, is increased. For this reason, by adjusting the inductance value, an arbitrary frequency in the desirable variable frequency range of $\Delta f$ can be used, and the inclination or gradient of the variation curve becomes gradual. As a result, the variable frequency range for selecting the desired frequency can be made great. If the oscillation equivalent capacity $C_o$ is changed by, for example, $\pm \Delta C_o$, the oscillation frequency is changed to $f_s \pm \Delta f_s$. Thus, in this example, $\pm \Delta f_s$ is the variable frequency range and hence is greater than that of the curve $l_1$. In this case, the oscillation equivalent capacity $C_o$ can be expressed as follows if the capacities of the first and second capacitors 2 and 3 and the capacity of the variable capacity diode 12 are taken $C_1$, $C_2$ and $C_D$, respectively.

$$\frac{1}{C_o} = \frac{1}{C_1} + \frac{1}{C_2} + \frac{1}{C_D}.$$

If the inductance is made variable, the variable frequency range can be made sufficiently great so that the frequency range of 2~3 MHz can be easily obtained by suitably selecting the inductance value as described previously. Therefore, the above conditions I and II can be easily satisfied by the provision of the coil 4 only.

If the variable oscillator circuit 10 is constructed by using the coil 4, then due to the fact that the vibrator 1 of lithium tantalate itself has a temperature characteristics which varies in a second order relationship so as to be graphically represented by a second degree curve opening upward and also that the coil 4 itself has temparature characteristics, the variation of the oscillation frequency in response to temperature changes becomes substantial with the result that a highly stable variable oscillator circuit can not be obtained. That is, the above condition III can not be satisfied.

In such a case, the coil 4 has such a temperature characteristic that its inductance value linearly changes greatly in response to the temperature change which is caused by the fact that the magnetic permeability of the core (ferrite core) of the coil 4 changes greatly in response to the temperature change. Therefore, if the oscillation frequency $f_s$ is selected at 26 MHz and the oscillation frequency $f_s$ is deviated between +400 KHz ($= f_s + \Delta f = f'_s$) and −600 KHz ($= f_s − \Delta f'_s = f''_s$), the temperature characteristics of the oscillation frequency can be shown in the graph of FIG. 3 of the accompanying drawings. In the graph of FIG. 3, a curve 15a shows the temperature characteristic at the frequency of $f_s$, a curve 15b the temperature characteristic at the frequency of $f'_s$ and a curve 15c the temperature characteristic at the frequency of $f''_s$, respectively. As may be apparent from the graph of FIG. 3, as the temperature is varied from +20°C to +40°C, the variation of about 300 PPM (which corresponds to ± 7.8 KHz in frequency variation) occurs. As a result, it may be apparent that if the oscillator circuit is used in the above construction, there is the attendant problem of stability of the frequency.

OBJECTS OF THE INVENTION

It is an object of the present invention to provide a novel variable oscillator whose oscillation frequency can be varied over a wide range.

It is another object of the present invention to provide a variable oscillator in which the frequency deviation can be made great at a predetermined oscillation frequency.

It is a further object of the present invention to provide a variable oscillator which may produce a stable oscillation frequency stable regardless of temperature variation.

It is yet a further object of the present invention to provide a variable oscillator which is simple in circuit construction and can be manufactured inexpensively.

It is a still further object of the present invention to provide a variable oscillator which is readily adapted for use in an FM wireless microphone.

Other objects, features and advantages of the present invention will become apparent from the following description taken in conjunction with the accompanying drawing.

SUMMARY OF THE INVENTION

In accordance with the present invention a variable oscillator is provided having a resonator made of lithium tantalate and connected in a first series circuit comprised of a variable inductance element and a capacitance element whose capacitance is changed linearly in response to temperature variations; a second series circuit is connected in parallel with the first circuit and is comprised of two capacitors, at least one of the two capacitors having its capacitance varied in response to said temperature variations in accordance with a second order relationship, the relationship being graphically represented by a second degree curve opening upward; and an output transistor having its base electrode coupled to the parallel-connected first and second series circuits.

DESCRIPTION OF THE PREFERRED EMBODIMENT

Figure 1:
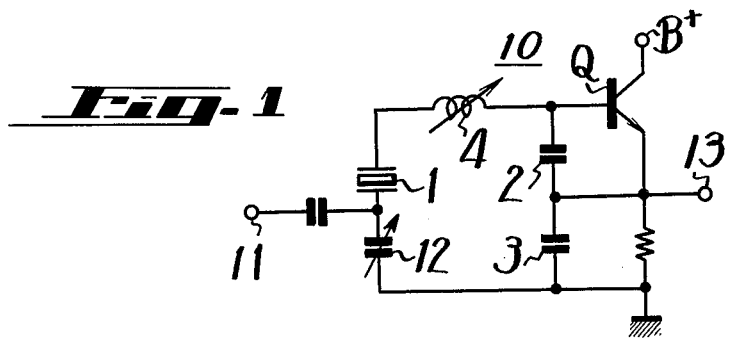
FIG. 1 is a circuit diagram showing an example of a proposed variable oscillator circuit which has been described.
Figure 2:
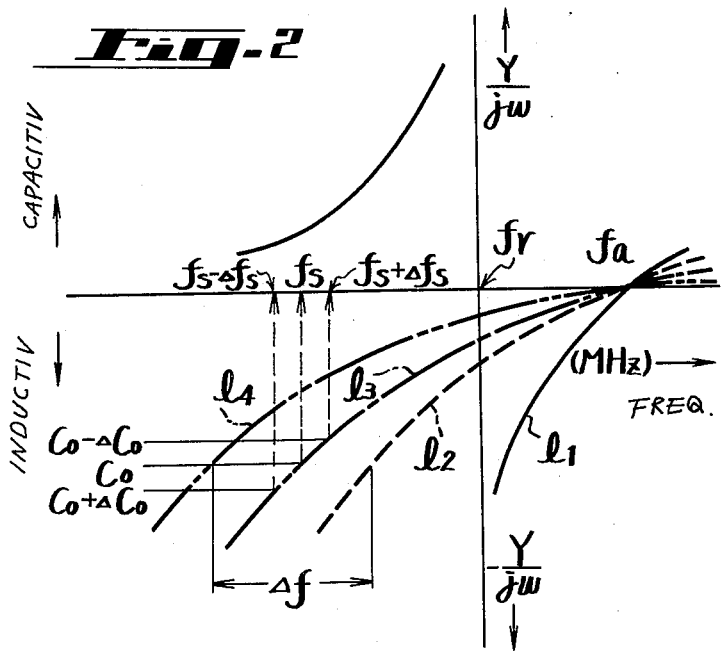
FIG. 2 is a graph representing the admittance characteristic of the lithium tantalate vibrator when the inductance of the FIG. 1 circuit is changed.

An embodiment of the variable oscillator circuit according to the present invention will be now described with reference to FIG. 4 in which the same reference numerals as those used in FIG. 1 designate the same elements.

Figure 4:
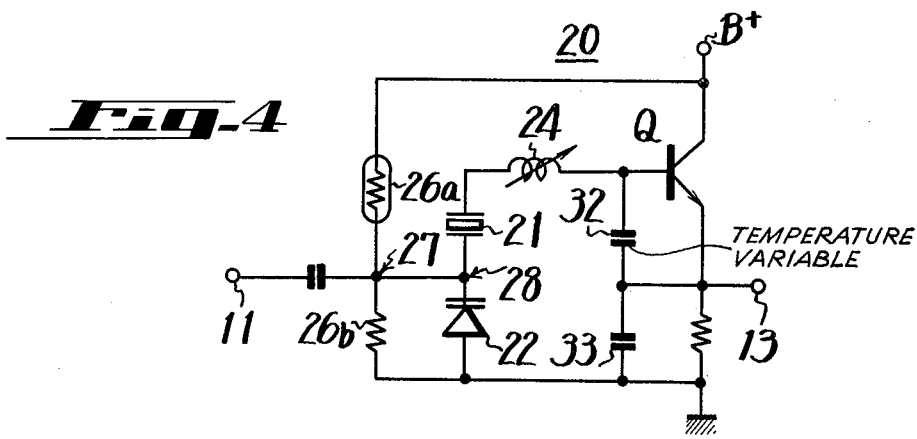
FIG. 4 is a circuit diagram showing an embodiment of the variable oscillator circuit according to the present invention.

In FIG. 4, reference numeral 20 generally indicates a variable oscillator circuit of the invention, in which a capacitance device 22 whose capacity is changed linearly in response to temperature variation is connected in series to a vibrator 21 made of lithium tantalate (LiTaO₃) and this series circuit is connected in parallel to a series connection of capacitors 32 and 33, the parallel circuits being connected to the base of the transistor Q. In this case, one of or both of the capacitors 32 and 33 is made to have such a temperature characteristic that its capacity varies in response to the temperature variation in accordance with a second order relationship which can be graphically represented by a second degree curve opening upward, thereby to improve the stability of the oscillation frequency for temperature variations.

Figure 5:
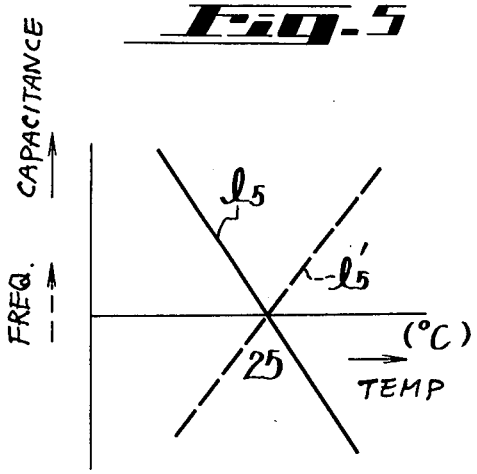
FIGS. 5 and 6 are graphs showing the temperature characteristics of different capacitors used in the oscilator circuit shown in FIG. 4.

One of the capacitors, for example, the capacitance device 22, will be now described. As shown in the graph of FIG. 5, a capacitor whose capacity may change linearly in response to temperature variations is used as the capacitance device 22. In this case, the capacitor is selected such that its capacity decreases when the temperature increases over the normal temperature (for example, 25°C) such as shown by a curve $l_5$ in FIG. 5. If the capacity changes as shown by the curve $l_5$, the oscillation equivalent capacity $C_o$ (described above) also changes therewith and consequently the oscillation frequency, of course, changes. This frequency variation in accordance with the capacity change is shown in FIG. 5 by a dotted line curve $l'_5$.

In practice, a variable capacity diode is used as the capacitor 22 with the capacity variation shown by the line $l_5$ in FIG. 5. The capacity of the variable capacity diode is changed with a modulating signal as described in connection with FIG. 1.

In the embodiment of FIG. 4, a connection point 27 between a variable resistance element 26a and a resistor 26b is connected to a connection point 28 between the variable capacity diode 22 and the vibrator 21. A semiconductor element whose resistance value changes in response to temperature variations is used as the variable resistance element 26a. As a result, since the bias voltage (divided voltage) obtained at the connection point 27 and hence at the connection point 28 changes in response to temperature variations, the capacity of the variable capacity diode 22 can be changed as shown in FIG. 5 by the line $l_5$.

Figure 3:
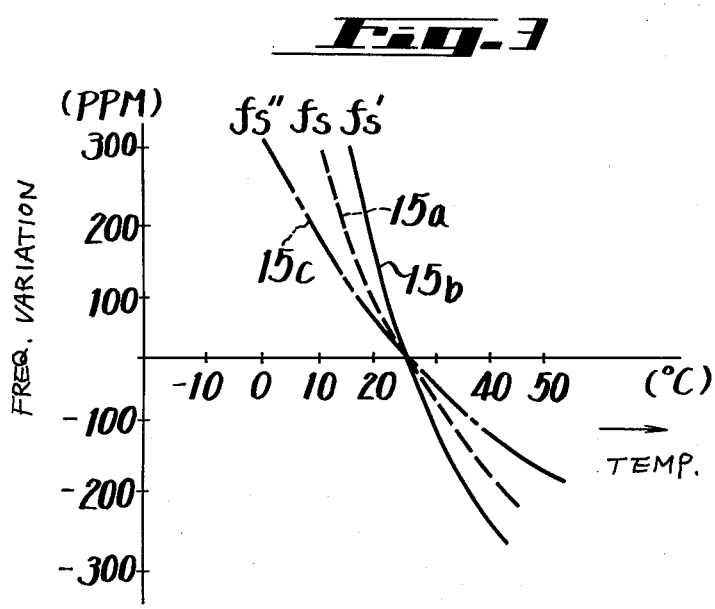
FIG. 3 is a graph showing the temperature characteristic of the oscillation frequency of the oscillator circuit shown in FIG. 1.
Figure 7:
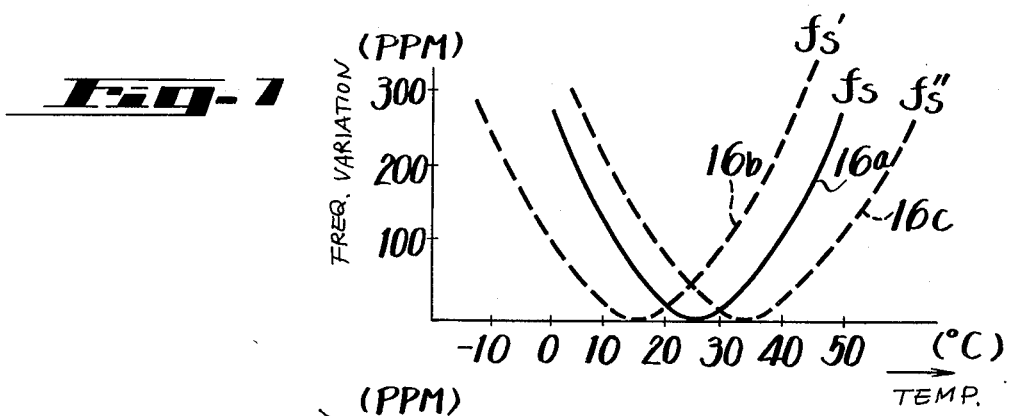
FIG. 7 is a graph showing the temperature characteristics of the oscillator circuit when temperature compensation of one capacitor is provided.

Accordingly, if the variable capacity diode 22 is connected in series to the LiTaO₃ vibrator 1 to which a coil 24 is connected in series, the variation of the oscillation frequency $f_s$ in response to temperature variations of the circuit elements is shown in FIG. 7 by second degree curves opening upward, based upon the characteristic curves shown in FIGS. 3 and 5.

In the graph of FIG. 7, a curve 16a shows the temperature dependency variation of the oscillation frequency at the frequency $f_s$. Similarly, in the graph of FIG. 7, a curve 16b shows the temperature dependent variation of the oscillation frequency at the frequency $f'_s$ and a curve 16c that at the frequency $f''_s$. However, as may be apparent from the graph of FIG. 7, if, by way of example, the frequency $f_s$ is assumed, a frequency variation of about 500 PPM occurs at a temperature of about 50°C. This frequency variation is great if the variable capacity diode 22 is provided only. That is not, a substantial compensation effect is carried out, and hence the variable oscillator circuit can not be practically used with desired effects.

Therefore, according to the invention the first capacitor 32 and/or the second capacitor 33 are provided with suitable temperature characteristics to decrease the temperature-dependent frequency variation.

The case where only the first capacitor 32 is provided with such temperature characteristics will be now described. The first capacitor 32, has a variable capacitance which changes in response to temperature variation in accordance with a second order relationship between capacitance and temperature, this relationship being graphically shown in the graph of FIG. 6 by a second degree curve $l_6$ opening upward. An example of such a capacitor is a ceramic capacitor. As is well known, the ceramic capacitor has a temperature characteristic represented by a second degree curve, such as a parabola, whose turning point is presented near the normal temperature. In this case, the variation of the oscillation frequency caused by the capacity variation of the first capacitor 32 can be shown by a dotted curve $l'_6$ in FIG. 6.

Figure 6:
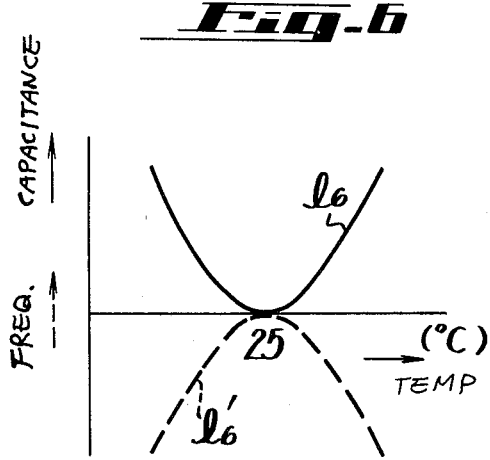
Figure 8:
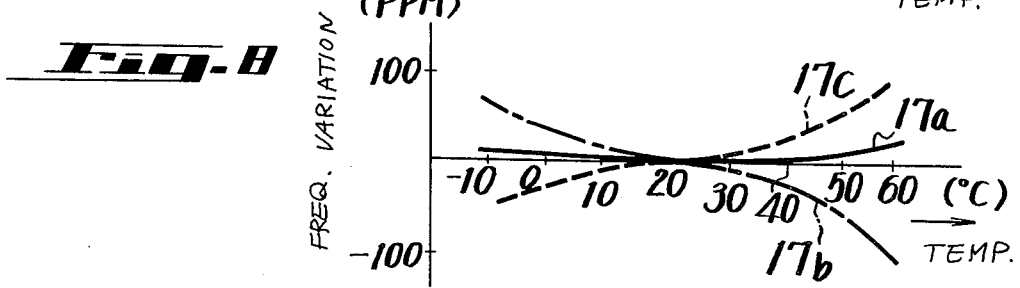
FIG. 8 is a graph showing the temperature characteristics of the oscillation frequency when temperature compensation of two capacitors is provided.

As a result, if the sum of the frequency deviations shown in FIGS. 6 and 7 is taken, the frequency deviation (variation) caused by the temperature variation becomes negative (or the frequency is lowered) about the normal temperature in FIG. 6 when the capacitor 32 is used, while the frequency deviation caused by temperature variation becomes positive (or the frequency is made high) when only the compensation of the variable capacity diode 22 is used as shown in FIG. 7. Accordingly, the deviation of the oscillation frequency $f_s$ of the entire oscillator circuit attributed to the compensation obtained from the capacitor 32 and the variable capacity diode 22 can be shown in FIG. 8 by curves 17a, 17b and 17c, respectively.

According to experiments, it has been ascertained that the frequency variation is lower than ± 100 PPM in the range of temperature variation from −10°C to +40°C and that, at a higher temperature of 60°C, the frequency variation is lower than ± 200 PPM to thus achieve a sufficient compensation effect.

As described above, the capacitance device 22 whose capacity is changed linearly with temperature variation and the capacitor 32 whose capacitance temperature characteristic is graphically represented by a second degree curve opening upward are provided in the variable frequency oscillator circuit 20 of the invention, so that the variation of oscillation frequency $f_s$ or $f_o$ in response to the temperature variations can be reduced effectively. As a result, the temperature characteristic of the oscillator circuit is improved and hence it is made to have a wide variable range of oscillation frequency and a great frequency deviation for FM. In addition thereto, the condition that the frequency stability is very high is also satisfied.

Further, the circuit construction of the invention is very simple, so that the variable oscillator circuit of the invention is small in size and inexpensive. For this reason, the variable oscillator circuit of the invention is especially useful when it is used as an FM modulator circuit in a wireless microphone. Even if the variable frequency range is selected between 2 and 3 MHz, the temperature-dependent frequency variation within the variable frequency range is very small as compared with that of the prior art. According to experiments, this frequency variation can be made smaller than ± 300 PPM within the range of $\Delta f$.

In the embodiment of the invention shown and described as above, the variable capacity diode is used as the capacitance device which has the linear temperature characteristic, but it is also possible that other conventional capacitors which have a linear temperature characteristic can be connected to the lithium tantalate vibrator 21 with the same effects. In such an alternative embodiment it is not necessary to provide the variable resistance element 26a and the resistor 26b.

Further, instead of the first capacitor 32, the second capacitor 33 can be provided with the second order capacitance-temperature relationship which is graphically represented by a second degree curve opening upward. As a further alternative, both of the first and second capacitors 32 and 33 can be provided with this capacitance-temperature relationship.

In the foregoing, only one preferred embodiment of the present invention is illustrated and described, but it will be apparent that many modifications and variations could be effected by those skilled in the art without departing from the spirit or scope of the novel concepts of the present invention and accordingly the scope of the invention should be determined by the appended claims.

I claim as my invention:

1. A variable frequency oscillator comprising a first series circuit including a resonator made of lithium tantalate, variable inductance means and first variable capacitance means whose capacitance varies linearly with temperature variations; a second series circuit connected in parallel to said first series circuit and including second capacitance means whose capacitance varies with said temperature variations in accordance with a second order relationship which is graphically represented by a second degree curve opening upward; and a transistor having its base electrode connected to said parallel connected first and second series circuits.

2. A variable frequency oscillator in accordance with claim 1 in which said first variable capacitance means is a variable capacity diode.

3. A variable frequency oscillator in accordance with claim 2 wherein said variable capacity diode is connected between said resonator and circuit ground; and said second capacitance means is connected between said transistor base eletrode and ground.

4. A variable frequency oscillator in accordance with claim 3, in which an input terminal which is supplied with a modulating signal is provided between said variable capacity diode and said resonator.

5. A variable frequency oscillator in accordance with claim 4, in which third capacitance means is connected in series between said second capacitance means and ground, the capacitance of said third capacitance means varying with said temperature variations in accordance with a second order relationship which is graphically represented by a second degree curve opening upward.

* * * * *